United States Patent

Ginsberg

[15] 3,644,753

[45] Feb. 22, 1972

[54] BIAS SENSING GATE DRIVER CIRCUITRY

[72] Inventor: Howard S. Ginsberg, Baltimore, Md.

[73] Assignee: Westinghouse Electric Corporation, Pittsburgh, Pa.

[22] Filed: June 22, 1970

[21] Appl. No.: 48,056

[52] U.S. Cl. ....................307/252 Q, 307/252 UA, 307/305

[51] Int. Cl. ....................H03k 17/00

[58] Field of Search ....................307/305, 252.70, 252.90

[56] References Cited

UNITED STATES PATENTS

| | | | |
|---|---|---|---|
| 3,335,291 | 8/1967 | Gutzwiller | 307/252 N |
| 3,335,354 | 8/1967 | Rowan | 307/252 N |
| 3,434,031 | 3/1969 | Wickliff | 307/252 Q |

*Primary Examiner*—Donald D. Forrer
*Assistant Examiner*—David M. Carter
*Attorney*—F. H. Henson, Charles F. Renz and A. Samuel Oddi

[57] ABSTRACT

Driver circuitry for sensing the direction of bias across controlled switching devices such as silicon controlled rectifiers and providing sufficient gate drive therethrough when the device is forward biased and removing the gate drive when reverse biased.

2 Claims, 1 Drawing Figure

PATENTED FEB 22 1972
3,644,753
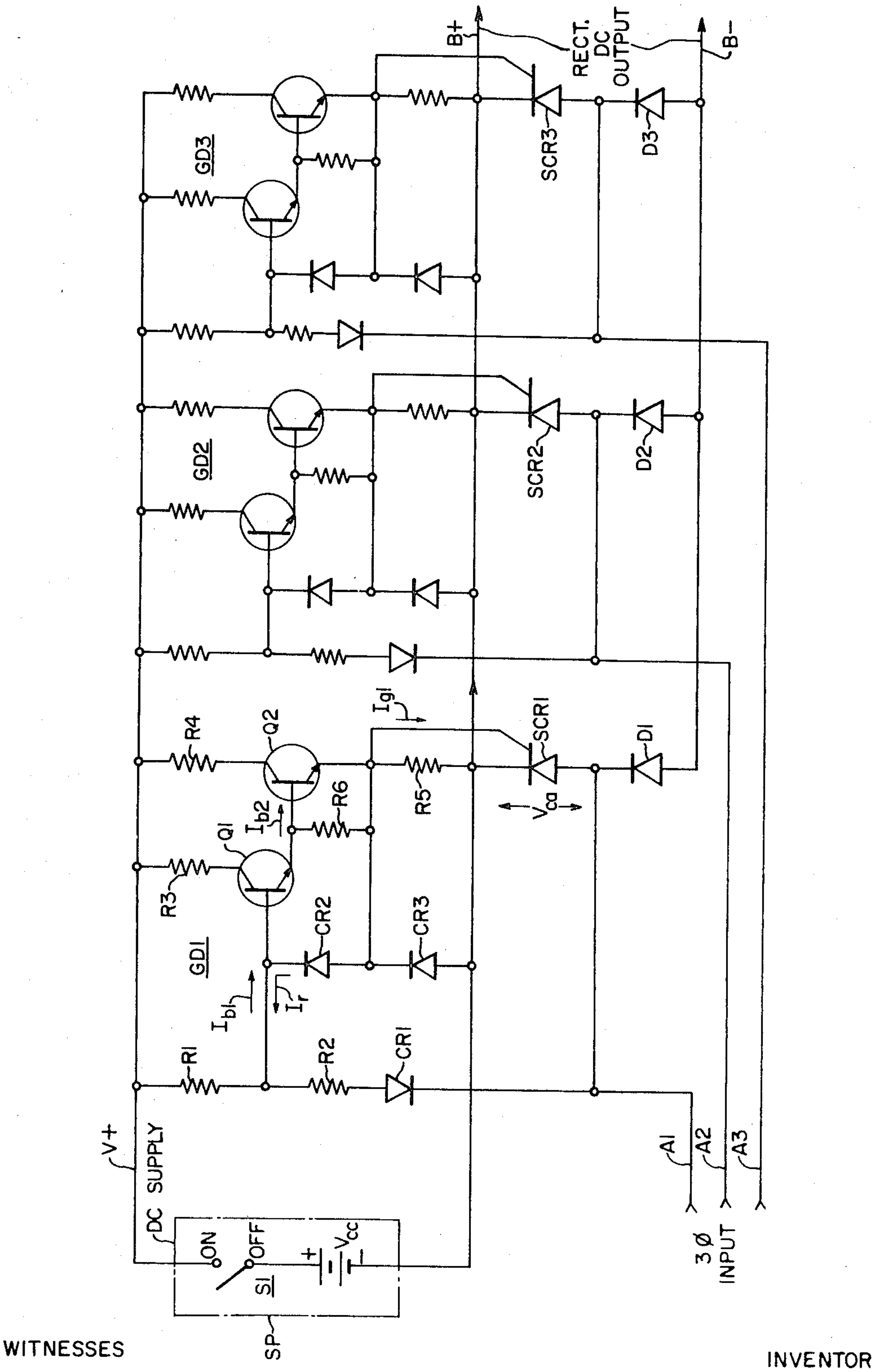
WITNESSES
Theodore F. Wrobel
James G. Young
INVENTOR
Howard S. Ginsberg
BY
D. Samuel Otti
ATTORNEY

BIAS SENSING GATE DRIVER CIRCUITRY

BACKGROUND OF THE INVENTION

1. Field of the Invention

The present invention relates to gate drive circuitry and more particularly, to such circuitry for sensing the direction of bias of controlled switching devices being driven thereby.

2. Discussion of the Prior Art

Controlled switching devices such as silicon controlled rectifiers (SCR's), thyratrons, and other equivalent switching devices are frequently employed in polyphase rectifier bridge circuits wherein a high-speed switch gear (ON-OFF control) function is provided. In this type of operation a polyphase alternating input is supplied to the bridge circuit and gate drive is continuously applied to all of the controlled switching devices when the rectified output of the bridge is desired (ON function). When no output is desired (OFF function), the gate drive is removed. With continuous gate drive being supplied to the controlled switching devices connected in an ideal $n$-phase rectifier bridge, each of the devices will conduct $100/n$ percent of the time while being forward biased and will be nonconductive for $100(1-1/n)$ percent of the time while being reverse biased. The application of forward gate drive when a controlled switching device is reversed biased causes an appreciable reverse current to flow through the device. This reverse current increases the heat generated in the device which could lead to device failure if the heat dissipating ability of the heat sink for the device were overtaxed. Moreover, because of the continuous application of gate drive, the average gate power dissipation is relatively high so that care must be taken to insure that the gate current employed does not exceed the maximum allowable average gate power rating of the device. The use of a relatively low gate drive current may seriously affect the reliability of turning on the controlled switching device particularly at low temperatures of operation.

SUMMARY OF THE INVENTION

Broadly, the present invention provides drive circuitry wherein the direction of bias across a control switching device is sensed and gate drive is supplied when the device is forward bias and removed when the device is reverse biased.

BRIEF DESCRIPTION OF THE DRAWING

The single FIGURE is a schematic diagram of the present invention incorporated into a three-phase bridge rectifier circuit.

DESCRIPTION OF THE PREFERRED EMBODIMENT

Referring to the FIGURE control switching devices SCR1, SCR2 and SCR3, which may comprise silicon controlled rectifiers, are shown connected in a three-phase bridge rectifier array which also includes diodes D1, D2, D3, respectively, connected in series with the switching devices SCR1, SCR2 and SCR3. A three-phase input is supplied to the bridge array through AC buses A1, A2 and A3. The AC buses A1, A2 and A3 are respectively connected to the anode-cathode junctions of the devices SCR1–D1, SCR2–D2 and SCR3–D3. The DC output of the bridge array is taken from a bus B+, respectively, connected to the common cathode connection of the controlled switching devices SCR1, SCR2 and SCR3 and a bus B– connected to the anodes of the diodes D1, D2 and D3.

Gate drive for the controlled switching devices SCR1, SCR2 and SCR3 is provided by bias sensing gate drive circuits GD1, GD2 and GD3, respectively. The circuits are identical and for the purpose of explanation only the gate drive circuit GD1 will be described in detail. Operating voltage for the gate drive circuits GD1, GD2 and GD3 is supplied from a floating DC supply SP. The DC supply SP include a battery $V_{cc}$ and an ON-OFF switch S1 connected in series therewith. With the switch S1 in the open condition, no gate drive is supplied to any of the controlled switching devices SCR1, SCR2 and SCR3; therefore, no rectified DC output is provided across the buses B+ and B–. By closing the switch S1 to the ON position, gate drive current is supplied to the respective drive circuits GD1, GD2 and GD3 and thence to the controlled switches SCR1, SCR2 and SCR3 respectively so that a rectified DC output is provided across the buses B+ and B– defining the ON condition of the system.

Assume that the switch S1 is switched to its ON position so that battery voltage $V_{cc}$ is applied to the gate drive circuits GD1, GD2 and GD3. Also assume that the phase of the three-phase voltages across the AC buses A1, A2 and A3 is such that the control switching device SCR1 is forward biased, that is, the anode electrode thereof is positive with respect to the cathode electrode.

A series circuit including a resistor R1, a resistor R2 and a diode CR3 is connected between a V+ line (connected via the switch S1 to the positive terminal of the battery $V_{cc}$) and the A1 bus. With the controlled switching device SCR1 forward biased by the voltage at the AC bus A1 and the voltage at the bus A1 being sufficiently positive, the diode CR1 will be reversed biased to block current flow therethrough. Thus base current $I_{b1}$ will be supplied to the base of a transistor Q1 via the resistor R1 from the V+ line. The current $I_{b1}$ will cause the transistor Q1 to saturate and supply current $I_{b2}$ to the base of a transistor Q2, which will saturate in response thereto. The collector of the transistor Q1 and the collector of the transistor Q2 are respectively connected through resistors R3 and R4 to the V+ line. The emitter of the transistor Q2 is connected to the gate electrode of the controlled switching device SCR1 and supplies a gating current $I_{g1}$ thereto. Due to the configuration of the transistors Q1 and Q2 providing current gain with the collector emitter-circuit of the transistor Q1 supplying the base-emitter circuit of the transistor Q2 and the gate current $I_{g1}$ being supplied from the collector-emitter circuit of the transistor Q2, relatively high gate current $I_{g1}$ will be supplied in response to a relatively small base current $I_{b1}$ supplied to the base of the transistor Q1.

With gate drive being supplied to the device SCR1 and the voltage on the AC bus A1 being positive, a current path will be supplied to the anode-cathode circuit of the device SCR1 to the B+ bus through a load (not shown) connected across the B+ and B– buses, and a return current path will be provided through the anode-cathode circuit of appropriate of the diodes D2, D3 to the respective buses A2, A3.

A resistor R5 is connected between the anode of the controlled switching device SCR1 and the emitter of the transistor Q3 which is selected to have a relatively low impedance in order to reduce the noise pickup at the gate electrode of the device SCR1. A resistor R6 is connected between the base and emitter electrodes of the transistor Q2 in order to improve the stability of this transistor at high operating temperatures by shunting leakage current away from the base electrode thereof.

When the phase of the AC bus A1 reverses and becomes negative, the controlled switching device SCR1 becomes reverse biased with the anode thereof becoming negative with respect to the cathode. Under the reverse bias condition of the device SCR1, the diode CR1 becomes forward biased along with a pair of diodes CR2 and CR3 which are connected in series between the cathode of the controlled switching device SCR1 and the base electrode of the transistor Q1. The anode-cathode junction of the diodes CR2 and CR3 is connected to the emitter-gate connection of the transistor Q2 and the device SCR1. A current $I_r$ is caused to flow in the circuit including the three diodes CR1, CR2 and CR3 and is equal to:

$$I_r=(V_{ca}-3V_{cr}/R2,$$

where $V_{ca}$ is the reverse bias voltage across the device SCR1 and $V_{cr}$ is the forward diode drop of each of the diodes CR1, CR2 and CR3. The magnitude of the current $I_r$ is such to overcome the current $I_{b1}$ in the base circuit of the transistor Q1 to cause the transistors Q1 and Q2 to be rendered nonconductive, thereby removing the gate drive from the controlled switching device SCR1 for the time period that the device SCR1 is reversed biased.

When the controlled switching device SCR1 is again forward biased and the diode CR1 is reverse biased, the current $I_r$ is blocked and the current $I_{b1}$ will again be applied to the base of the transistor Q1 thereby causing the transistor Q1 to saturate, and in response thereto the transistor Q2 will saturate to supply the gating current $I_{g1}$ again to the controlled switching device SCR1.

It can thus be seen that the bias sensing gate drive circuit of the present invention has the advantage of removing the gate drive from the controlled switching devices SCR1, SCR2 and SCR3 when these devices are reverse biased, thereby minimizing the power dissipation in these devices and the heat generated therein. Moreover, by the removal of the gate drive when the controlled switching devices are reversed biased, the average gate power dissipation is also reduced. This permits the controlled switching devices to be driven at higher gate current levels without exceeding the maximum allowable average gate power rating which insures more reliable turn-on of the controlled switching devices at low temperatures.

The bias sensing driver circuits GD2 and GD3 operate identically with the driver circuit GD1 and respectively cause the gate drive to be removed from the controlled switching devices SCR2 and SCR3 when the devices are reversed biased according to the phase relationship of the AC buses A1, A2 and A3 of the three-phase input.

I claim as my invention:

1. An apparatus including at least one controlled switching device which is alternately forward and reverse biased, a gate drive circuit comprising:

means for sensing whether said controlled switching device is forward or reverse biased including a first unidirectional device which is reverse biased in response to said controlled switching device being forward biased and forward biased in response to said controlled switching device being reverse biased;

means for supplying gate drive to said controlled switching device when said controlled switching device is sensed by said sensing means to be forward biased including amplifying means receiving an input from said sensing means when said first unidirectional device is reverse biased to supply said gate drive at an increased current gain to said controlled switching device and receiving no input when said controlled switching device is reverse biased; and means for terminating said gate drive when said controlled switching device is sensed by said sensing means to be reverse biased including a second unidirectional device operatively connected in circuit with said controlled switching device and said first unidirectional device with current being provided in the forward direction of said second unidirectional device in response to the reverse voltage across said controlled switching device to terminate said input from said sensing means.

2. In the apparatus of claim 1 including a polyphase rectifier bridge circuit with each leg thereof including one of said controlled switching devices, a polyphase input which supplies the input to said bridge circuit and a DC output being supplied by said bridge circuit wherein one of said gate drive circuits is operatively associated with the controlled switching device of each of said legs of said bridge circuit and includes:

a DC supply for supplying operating voltage to said gate drive circuits, said means for sensing includes one of said first unidirectional devices operatively connected between said DC supply and each phase of said polyphase source, said first unidirectional device is reverse biased when the associated controlled switching device is forward biased and is forward biased when the associated controlled switching device is reverse biased.

* * * * *